US012184302B2

(12) United States Patent
Zhou

(10) Patent No.: US 12,184,302 B2
(45) Date of Patent: Dec. 31, 2024

(54) DATA REGISTER UNIT, SAR ADC AND ELECTRONIC DEVICE

(71) Applicant: SILEAD Inc., Shanghai (CN)

(72) Inventor: Jinling Zhou, Shanghai (CN)

(73) Assignee: SILEAD Inc., Shanghai (CN)

( * ) Notice: Subject to any disclaimer, the term of this patent is extended or adjusted under 35 U.S.C. 154(b) by 156 days.

(21) Appl. No.: 17/994,803

(22) Filed: Nov. 28, 2022

(65) Prior Publication Data

US 2023/0291415 A1 Sep. 14, 2023

(30) Foreign Application Priority Data

Mar. 10, 2022 (CN) .......................... 202210240853.7

(51) Int. Cl.
*H03M 1/38* (2006.01)
*H03M 1/46* (2006.01)

(52) U.S. Cl.
CPC .................................. *H03M 1/466* (2013.01)

(58) Field of Classification Search
CPC ............................... H03M 1/466; H03M 1/38
USPC ........................................ 341/161, 155, 172
See application file for complete search history.

(56) References Cited

U.S. PATENT DOCUMENTS 6,307,400 B1* 10/2001 Kim ..................... G11C 7/1078
326/83
2020/0077039 A1* 3/2020 Zimmerman ......... H03M 1/462

OTHER PUBLICATIONS

Huang, Guanzhong, and Pingfen Lin. "1.1 V, 8 bit, 12 MS/s asynchronous reference free successive approximation register analogue to digital converter in 0.18 m CMOS with separated capacitor arrays." IET Circuits, Devices and Systems 7.1 (2013): 1-8.
Huang, Guanzhong, and Pingfen Lin. "A 15fJ/conversion-step 8-bit 50 MS/s asynchronous SAR ADC with efficient charge recycling technique." Microelectronics Journal 43.12 (2012): 941-948.
Zhu, Zhangming, et al. "A 1.33 W 10-bit 200KS/s SAR ADC with a tri-level based capacitor switching procedure." Microelectronics Journal 44.12 (2013): 1132-1137.
Yoon, Yeonam, and Nan Sun. "A 6-bit 0.81-mW 700-MS/s SAR ADC with sparkle-code correction, resolution enhancement, and background window width calibration." IEEE Journal of Solid-State Circuits 53.3 (2017): 789-798.

\* cited by examiner

*Primary Examiner* — Peguy Jean Pierre
(74) *Attorney, Agent, or Firm* — IPro, PLLC

(57) ABSTRACT

A data register unit, a SAR ADC and an electronic device are disclosed. The data register unit comprises: a first high-speed flip-flop; a second high-speed flip-flop; and a first logic gate, wherein the first high-speed flip-flop and the second high-speed flip-flop comprise a high-speed flip-flop circuit respectively, which comprises: a first PMOS transistor, a first NMOS transistor, an inverter and a logic gate. The data register unit of the present disclosure is composed of a high-speed flip-flop circuit with a very simple structure and suitable for fast operation. In a further embodiment, the high-speed flip-flop circuit can combine the bit pulse to realize the capacitor switching based on the comparison result. This increases the operation speed of the SAR ADC while significantly reducing the number of transistors required to implement the EMCS logic.

20 Claims, 7 Drawing Sheets

DATA REGISTER UNIT, SAR ADC AND ELECTRONIC DEVICE

CROSS-REFERENCE TO RELATED APPLICATIONS

This application claims priority to a Chinese patent application No. 202210240853.7 filed on Mar. 10, 2022, the disclosure of which is incorporated herein by reference in its entirety.

TECHNICAL FIELD

The present disclosure relates to the field of circuits, and in particular, to a data register unit, a SAR DAC, and an electronic device.

BACKGROUND

The successive approximation analog-to-digital converter (i.e., SAR ADC) is a common analog-to-digital conversion component, typically used at moderate to high-resolution sampling rates, and is widely used for its low power consumption and small size.

The current common SAR ADC mainly includes CDAC (capacitive digital-to-analog converter), comparator and SAR control logic. The SAR control logic is mainly composed of a shift register and a data register. These registers require the use of a large number of D flip-flops. Although the existing conventional D flip-flop is reliable, it operates slowly and uses a large amount of transistors.

Therefore, a SAR control logic implementation scheme with simpler structure and faster operation is required.

SUMMARY

The present disclosure provides a data register unit, a SAR ADC, and an electronic device. The data register unit of the present disclosure is composed of a high-speed flip-flop circuit with a very simple structure and suitable for fast operation. In a further embodiment, the high-speed flip-flop circuit of the present disclosure can combine bit pulses to achieve capacitor switching based on the comparison result. This increases the operation speed of the SAR ADC while significantly reducing the number of transistors required to implement the EMCS logic.

According to a first aspect of the present disclosure, a data register unit is provided, comprising: a first high-speed flip-flop; a second high-speed flip-flop; a first logic gate, wherein, the first high-speed flip-flop and the second high-speed flip-flop include a high-speed flip-flop circuit respectively, and the high-speed flip-flop circuit includes: a first PMOS transistor, a first NMOS transistor, an inverter and a logic gate, the source of the first PMOS transistor is connected to a power supply terminal, the gate is connected to the output of the first logic gate, the drain is connected to a first node, and the drain of the NMOS transistor is connected to the first node and the gate is connected to the output terminal of the logic gate, the source is connected to the common connection end, one terminal of the inverter is connected to the first node, and the other terminal is used as the output terminal of the high-speed flip-flop circuit.

Optionally, one input terminal of the respective logic gates of the first high-speed flip-flop and the second high-speed flip-flop is used to receive the bit pulse of a current bit, and the other input terminal is used to receive opposite bit comparison results of a most significant bit (MSB), so that the respective output terminals of the first high-speed flip-flop and the second high-speed flip-flop output flip-flop outputs opposite to each other and corresponding to the comparison result of the MSB when the bit pulse of the current bit is valid; one input terminal of the first logic gate is used to receive the bit pulse of a next bit, and the other input terminal is used to receive an XOR signal, and the XOR signal is used to become valid when the comparison result of the next bit is different from the comparison result of the MSB, and the first logic gate sends a first reset signal to the gate of the first PMOS transistor under the condition that the bit pulse of the next bit and the XOR signal are valid at the same time, so that both outputs of the first high-speed flip-flop and the second high-speed flip-flop are reset.

Optionally, the comparison result of the MSB and the comparison result of the next bit are generated by the comparator operating under the control of a operating clock, and the bit pulse is a signal generated when a bit output signal of the shift register and a delayed and narrowed operating clock are valid at same time, and.

Optionally, the high-speed flip-flop circuit further comprises: a second PMOS transistor, the source of the second PMOS transistor is connected to the power supply terminal, the gate is connected to a reset clock, and the drain is connected to the first node, wherein, the second PMOS transistor is turned on when the reset clock is valid, to reset the output of the high-speed flip-flop circuit.

According to a second aspect of the present disclosure, a successive approximation analog-to-digital converter (SAR ADC) is provided, comprising: a comparator; a capacitive digital-to-analog converter (CDAC); and a logic control circuit, the logic control circuit includes: a shift register; and a data register consisting of the data register unit according to the first aspect of the present disclosure.

Optionally, the SAR ADC is an n-bit ADC, and the data register is composed of n the data register units, and, when the bit pulse of the current bit is valid, each data register unit receives and outputs the comparison result of the most significant bit, and the output is used by the CDAC to connect the current bit capacitor to the power supply terminal and to ground, each of the data register units resets the output when the bit pulse of the next bit is valid and the XOR signal is valid at the same time, and the reset output is used for the CDAC to connect the current bit capacitor to common mode voltage.

Optionally, the logic control circuit further comprises: a flip-flop for storing the most significant comparison result, configured to receive and latch the most significant comparison result when the most significant bit pulse is valid, which will be used by each of the data register units.

Optionally, the logic control circuit further comprises: an exclusive OR logic gate, configured to receive the next bit comparison result and the most significant bit comparison result as input, and output an X signal as an input to the first logic gate when the next bit comparison result is different from the most significant bit comparison result.

Optionally, the comparator is a dynamic comparator that operates under the control of the operating clock, and the logic control circuit further comprises: a bit pulse generation logic gate, configured to generate the bit pulse when the bit output signal of the shift register and the delayed and narrowed operating clock are valid at the same time, wherein the operating clock is delayed until the dynamic comparator generates a comparison result before it becomes valid.

According to a third aspect of the present disclosure, an electronic device comprising a SAR ADC is provided, the SAR ADC comprising a data register for Merged Capacitor switching (MCS) is provided, the data register comprising a high-speed flip-flop circuit that generates a capacitor connection signal based on a bit comparison result, wherein the high-speed flip-flop circuit comprises: a first PMOS transistor, a first NMOS transistor, an inverter, and a logic gate, wherein the source of the first PMOS transistor is connected to a power supply terminal, the gate is connected to the bit comparison result, and the drain is connected to a first node (A), the drain of the first NMOS transistor is connected to the first node, the gate is connected to the output terminal of the logic gate, the source is grounded (VSS), one terminal of the inverter is connected to the first node, and the other terminal is used as the output of the high-speed flip-flop circuit.

Optionally, the bit comparison result indicates whether a comparison result of a next bit is different from a comparison result of a most significant bit (MSB).

Optionally, the data register is for Early Merged Capacitor switching (EMCS), when a bit pulse of a current bit is valid, each of the n data register units receives and outputs a comparison result of a most significant bit (MSB), and the output is used by the CDAC to connect current bit capacitors to the power supply terminal and to ground, respectively, and when the bit comparison result indicates a comparison result of a next bit is different from a comparison result of a MSB, each of the n data register units resets the output, wherein the reset output is used for the CDAC to connect the current bit capacitors to common mode voltage.

Optionally, the data register is for Merged Capacitor switching (MCS), when a bit pulse of a current bit is valid, each of the n data register units receives and outputs a comparison result of a most significant bit (MSB), and the output is used by the CDAC to connect current bit capacitors to the power supply terminal and to ground, respectively, and when the bit comparison result indicates a comparison result of a next bit is different from a comparison result of a MSB, each of the n data register units resets the output, wherein the reset output is used for the CDAC to reverse the connection of the current bit capacitors.

Thus, a data register unit composed of a high-speed flip-flop circuit with extremely simple structure and suitable for fast operation is realized, which can replace the data register unit composed of conventional D flip-flops in the EMCS control logic. The above data register unit can be combined with bit pulses to realize reliable reading of the capacitance switch signal based on the comparison result.

BRIEF DESCRIPTION OF FIGURES

The above and other objects, features and advantages of the present disclosure will become more apparent from the more detailed description of the exemplary embodiments of the present disclosure taken in conjunction with the accompanying drawings, wherein the same reference numerals generally refer to the same parts in exemplary embodiments of the present disclosure.

DETAILED DESCRIPTION

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

It should be understood that the "first" and "second" mentioned in the present disclosure are only used to distinguish different objects of the same kind, and do not imply the order, importance, etc. of these objects.

Figure 1:
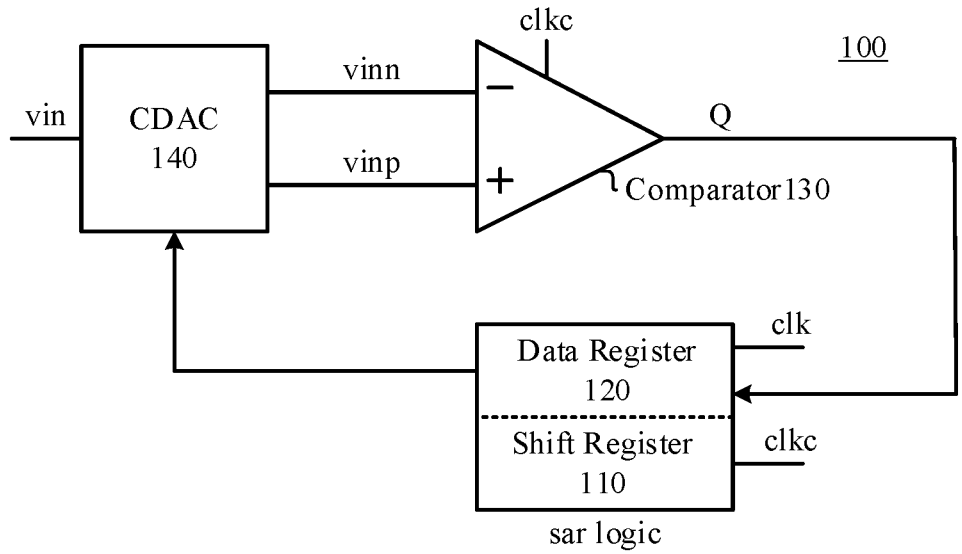
FIG. 1 shows an example of the composition of a SAR ADC.

A successive approximation analog-to-digital converter (ie, SAR ADC) is a common analog-to-digital conversion element. As the name suggests, a "successive approximation" ADC essentially implements a binary search algorithm. Although the ways in which SAR ADCs are implemented vary widely, the basic structure is generally similar. FIG. 1 shows an example of the composition of a SAR ADC. As shown, the SAR ADC 100 may include a shift register 110, a data register 120, a comparator 130 and a digital-to-analog converter (DAC) 140.

To implement the binary search algorithm, the N-bit data register 120 is first set at midscale (ie: 100 . . . 00, MSB set to 1). In this way, the VDAc output from t DAC 140 is initially set to $V_{REF}/2$, where $V_{REF}$ is the reference voltage provided to the SAR ADC 100. As shown, the DAC 140 is implemented as a capacitive digital-to-analog converter (CDAC), and the input VIN to be analog-to-digital converted by the SAR ADC 100 and the VDAc output by the DAC 140 are denoted as vinn and vinp. Then, the comparator 130 determines whether the input voltage VIN is smaller or larger than $V_{DAC}$. If $V_{IN}$ is greater than $V_{DAC}$, the comparison result Q output by the comparator 130 is a logic high level or 1 (it may also be a low level or 0 based on different logic implementations), and the MSB of the N-bit data register 120 is kept as 1. On the contrary, if $V_{IN}$ is less than VDAC, the comparison result Q output by the comparator 130 is a logic low level, and the MSB of the N-bit data register 120 is cleared to 0. Here, the data register 120 uses clk as the clock to read the comparison result Q as the input, the output of the data register 120 determines the connection of the capacitors in DAC 140, and DAC 140 then outputs the analog voltages vinn and vinp according to the adjusted capacitors for the comparator 130 to compare. Shift register 110 moves to the next bit and sets that bit high for the next comparison. This process continues until the LSB. After the above operations are completed, the analog-todigital conversion is completed, and the N-bit conversion result is stored in the data register 120. Here, the shift register 110 and the data register 120 can also be regarded together as SAR control logic, ie, SAR logic.

The two relatively important components of a SAR ADC are the comparator and the DAC, and the speed of the SAR ADC is limited by two conditions: the settling time of the DAC, during which it must settle within the resolution of the entire converter (eg: ½ LSB); the comparator, which must be able to resolve small differences in $V_{IN}$ and $V_{DAC}$ within the specified time; and logic overhead.

The maximum settling time of a DAC is usually determined by the settling time of its MSB, because changes in the MSB represent the maximum excursion of the DAC output. In addition, the linearity of the ADC is also limited by the linearity specification of the DAC. Therefore, SAR ADCs with resolutions higher than 12 bits often require conditioning or calibration to improve their linearity specifications due to inherent component matching limitations. In practical DAC designs, the matching of components usually limits the linearity specification to around 12 bits.

The DAC in a SAR ADC can be implemented in many ways, such as a CDAC (capacitive DAC) as shown in FIG. 1 or an RDAC (resistive DAC). However, since the capacitor can store the charge, charge redistribution can be done during sample/hold and SAR ADC conversion. This is why most designs use CDACs.

Figure 2:
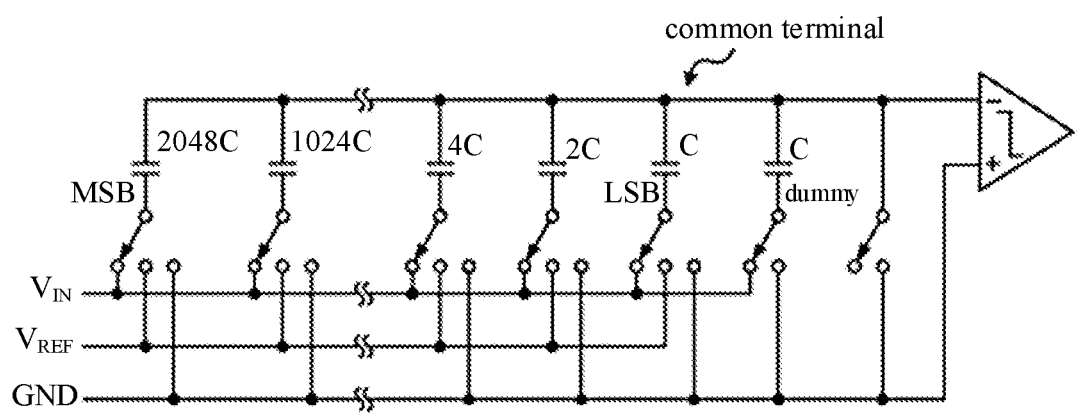
FIG. 2 is an example of a 12-bit CDAC connected to a comparator.

A capacitive DAC consists of an array of N capacitors arranged in a binary weighted arrangement and a "dummy LSB" (i.e., Dummy LSB) capacitor. FIG. 2 is an example of a 12-bit capacitive DAC connected to a comparator. Here, if the LSB capacitance value is set to C, the sum of the capacitances of N+1 capacitors is exactly equal to $2^N C$, which is $2^{12}=4096$ C in the example of FIG. 2.

During the sampling phase, the common terminal of the array (i.e., the common point to which all capacitors are connected) is grounded, and all free terminals are connected to the input signal ($V_{IN}$). After sampling, the common terminal is disconnected from ground, and the free terminal is disconnected from $V_{IN}$, effectively obtaining a charge proportional to the input voltage on the capacitor array. Then, connect the free terminals of all capacitors to ground and drive the common terminal to a negative voltage-$V_{IN}$.

As the first step of the binary search algorithm, the bottom terminal of the MSB capacitor is disconnected from ground and connected to $V_{REF}$, driving the common terminal voltage toward the positive terminal by $\frac{1}{2}V_{REF}$.

Therefore, $V_{common} = -V_{IN} + \frac{1}{2} \times V_{REF}$

If $V_{common} < 0$ (that is, $V_{IN} > \frac{1}{2} \times V_{REF}$), the comparator output is a logic 1 (for example, the Q in FIG. 1 outputs a high pulse). If $V_{IN} < \frac{1}{2} \times V_{REF}$, the comparator output is a logic 0 (e.g., Q in FIG. 1 remains low).

If the comparator output is a logic 1, the bottom of the MSB capacitor remains connected to $V_{REF}$. Otherwise, the bottom of the MSB capacitor connects to ground.

Next, the bottom of the next smaller capacitor is connected to $V_{REF}$ and the new $V_{common}$ voltage is compared to ground.

Continue the above process until the values of all bits are determined.

In short, $V_{common} = -V_{IN} + B_{N-1} \times V_{REF}/2 + B_{N-2} \times V_{REF}/4 + B_{N-3} \times V_{REF}/8 + \ldots + B_{0} \times V_{REF}/2^{N-1}$ (B_is Comparator output/ADC output bit).

Here, an operation in which the comparator outputs a logic 1 and the bottom of the previous bit capacitor remains connected to $V_{REF}$ can be referred to as an "up" transition; whereas an operation in which the comparator outputting a logic 0 and the bottom of the previous bit capacitor is changed to ground can be referred to as an "down" transition. Obviously, during the "down" transition, changing the capacitor to ground means discarding the charge already stored on the array. If these charges, which would otherwise be discarded, can be better utilized, energy can be saved during switching and thus the power consumption of the CDAC can be reduced. To this end, in the improved CDAC structure and switching scheme, the largest capacitor in the array (for example, the MSB capacitor with a value of 2048 C shown in FIG. 2) can be split into capacitor sub-arrays, and the switching is optimized to minimize the power consumption of the CDAC.

Figure 3:
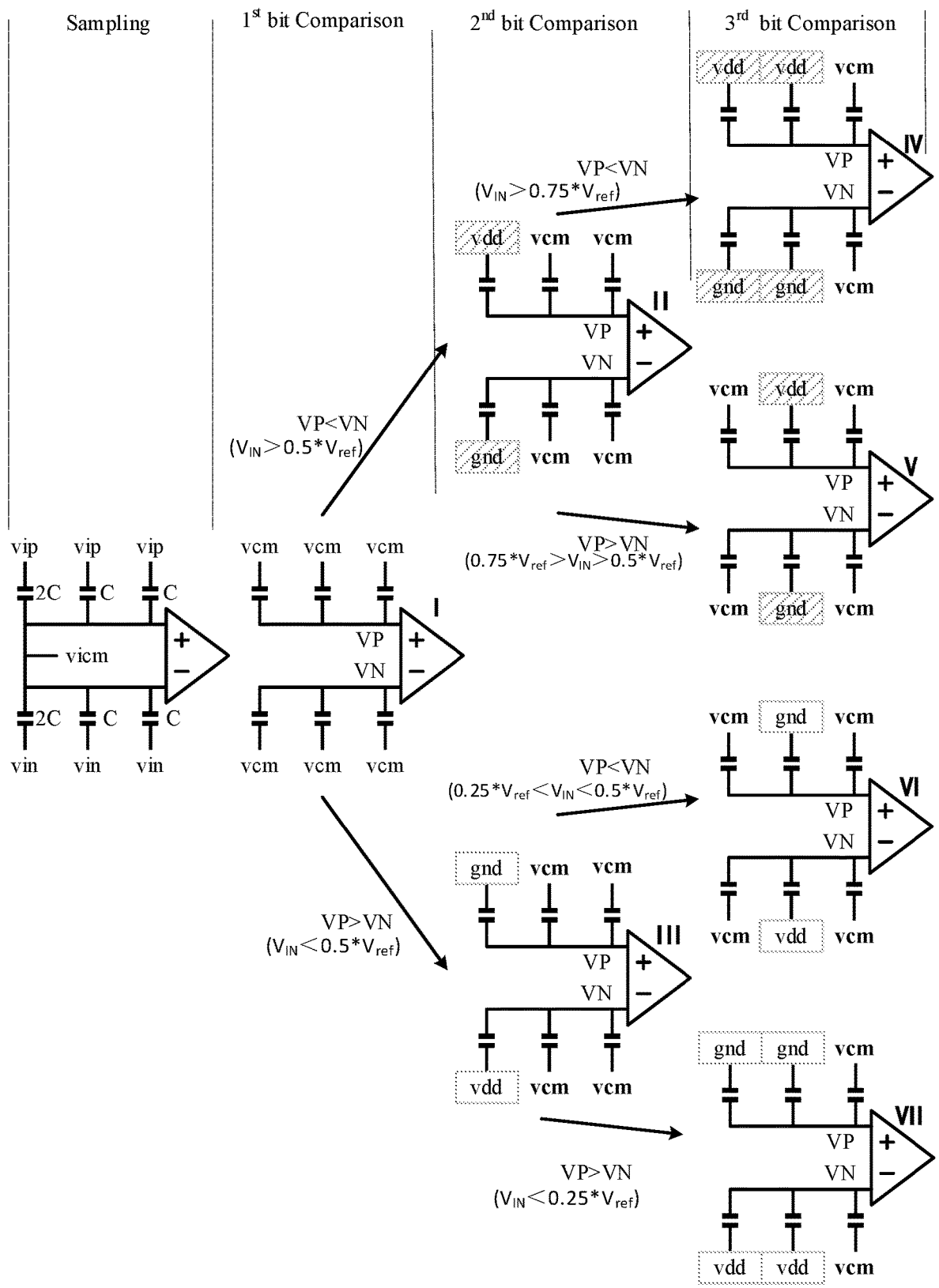
FIG. 3 shows a schematic diagram of the switching logic for the CDAC in the EMCS SAR ADC.

Among various SAR DAC power optimization schemes, the EMCS (Early Reset Merged Capacitor Switching) algorithm can maximize energy savings. FIG. 3 shows a schematic diagram of the switching logic for the CDAC in the EMCS SAR ADC. For ease of illustration, FIG. 3 shows only a 3-bit CDAC, but it is apparent that the EMCS switching logic scheme shown in FIG. 3 is also applicable to CDACs with fewer or more bits.

In the switching logic based on the reference common-mode voltage vcm, the MSB capacitor shown in FIG. 2 is split based on binary weighting. That is, in an n-bit CDAC, the MSB capacitor with a value of $2^{n-1}$ C shown in FIG. 2 is split into n capacitors with value of $2^{n-2}$ C, $2^{n-3}$ C, ... 2C, C and C (dummy), i.e. a sub-array of capacitors as described above. In the 3-bit implementation shown in FIG. 3, that is, the MSB of 4 C is split into 2C-C-C. Therefore, from the capacitor form of 4C (MSB)-2C-C(LSB)-C(Dummy) shown in FIG. 2, it is split into the upper and lower groups of 2C-C-C capacitors shown in FIG. 3 (that is, a total of 2n capacitors) form.

For example, if the reference voltage is $V_{ref}$ (or the power supply voltage $V_{dd}$), the reference common-mode voltage vcm may take a value of $0.5 \times V_{REF}$. In the two groups of capacitors shown in FIG. 3, one end of each group connected to the comparator is called a capacitor top plate, and the other end is called a capacitor bottom plate. The existence of the reference common mode voltage vcm makes the voltage connected to the bottom plate can go up or down. Specifically, after the sampling is completed, the capacitor bottom plate is connected to the reference common mode voltage vcm, and during subsequent comparison, the capacitor bottom plate can be changed to connect to $V_{REF}$ or gnd according to the comparison result, so that the input voltage of the comparator becomes larger and smaller.

Based on the comparison output from the comparator (for example, whether Q is 1 or 0), the switch control logic of the capacitor can output one of three signals including up, dn (i.e., down) and vcm to control the switches in the CDAC (Switches are not shown in FIG. 3 for clarity of illustration) so that their capacitors are connected to vdd (ie, the supply voltage or reference voltage $V_{REF}$), gnd (ie, ground), and vcm, respectively, thereby allowing subsequent inputs VP/VN of the comparator larger, smaller or unchanged correspondingly.

FIG. 3 shows the effect of the difference comparison result between the current bit and the MSB on the previous bit (it can also be regarded as the effect of the difference comparison result between the next bit and the MSB on the current bit). First, in the sampling phase, one end of the upper and lower groups of capacitors is connected to vicm (as mentioned above, this end is the capacitor top plate), and the other end is connected to vip and vin (this end is the capacitor bottom plate). When the first bit comparison is performed, the upper and lower groups of capacitors are in the connection state shown in state I in FIG. 3, that is, the top plate is disconnected from vicm, and the bottom plate is disconnected from the input vip/vin and connected to vcm. The connection of the bottom plate to vcm can be realized by clksn, which is the inverse signal of clks, indicating that the capacitor bottom plate is connected to vcm after sampling.

Then, if the comparison result of the first bit is VP<VN, then the highest-order capacitor of the upper group can be connected to Vdd, and the highest-order capacitor of the lower group can be connected to gnd, which corresponds to the state II shown in the figure; if the comparison result is VP>VN, then the highest-order capacitor of the upper group can be connected to gnd, and the highest-order capacitor of the lower group can be connected to Vdd, which corresponds to the state III shown in the figure. The state II and state III obtained by connecting the capacitors correspondingly according to the different comparison results of the first bit are used for the comparison of the second bit.

In the subsequent comparison after the first bit, the following rules can be followed (this connection rule of EMCS can minimize the power consumption of the SAR ADC): Take the comparison result of the first bit (that is, the comparison result of the MSB) as a reference, if the comparison result of a remaining bit is the same as the comparison result of the first bit, the connection method of the capacitor of the first bit is copied for the remaining bit. If it is different, the connection method of the capacitor of the first bit is still copied, but the previous bit needs to be reset (ie, connected back to vcm).

The specific explanation is as follows. As shown in the figure, when the comparison result of the second bit is the same as the comparison result of the first bit, the capacitor connection state of the first bit is copied. For example, on the basis of the comparison result of the first digit being VP<VN, the comparison result of the second digit is still VP<VN, then the second-highest capacitor of the upper group of capacitors can also be connected to Vdd, and the second-highest capacitor of the lower group of capacitors can be connected to gnd, which corresponds to state IV as shown. Similarly, on the basis of the comparison result of the first digit being VP>VN, the comparison result of the second digit is still VP>VN, then the second-highest capacitor of the upper group of capacitors can also be connected to gnd, and the second-order capacitor of the lower group of capacitors can be connected to Vdd, which corresponds to state VII as shown.

When the comparison result of the second bit is different from that of the first bit, the second bit still replicates the capacitor connection state of the first bit, but the corresponding capacitor of the first bit needs to be changed to be connected to vcm. For example, on the basis of the comparison result of the first bit being VP<VN, the comparison result of the second bit is the opposite, VP>VN, then the second-highest capacitor of the upper group of capacitors can also be connected to Vdd, and the lower group of capacitors can also connected to gnd, but the highest capacitor needs to be reset and connected to vcm, which corresponds to the state V shown in the figure. Similarly, on the basis of the comparison result of the first bit being VP>VN, the comparison result of the second bit is the opposite, VP<VN, then the second-highest capacitor of the upper group of capacitors can also be connected to gnd, and the lower group of capacitors can be connected to vdd, but the highest capacitor needs to be reset and connected to vcm, which corresponds to the state VI shown in the figure. The resulting capacitor connection states of states IV-VII can then be used as a third bit comparison.

In order to facilitate understanding, the reset connection vcm is set as a Bold in FIG. 3, the vdd and gnd of the basic connection whose first comparison result is VP<VN are set as a diagonal background, and the vdd and gnd of the basic connection whose first comparison result is VP>VN are set to white background. By distinguishing between different backgrounds, it can be easily seen that the connection method of the subsequent bits can only be the same as the connection method of the first bit, or connected to vcm (the SAR logic control circuit shown in FIG. 4 below is also designed according to this rule).

In addition, it should be understood that the above comparison results based on VP and VN can be reversed through the built-in inverter of the comparator, or a non-zero voltage can be connected to the reference terminal to add an offset to $V_{IN}$ relative to $V_{REF}$. Such variations as above are within the scope of the principles of the present disclosure.

It can be seen from the above that in the comparison process of multi-bit CDAC, the comparison result of the current bit will determine whether the previous bit is changed from connecting vdd and ground respectively to connecting both capacitors to vcm.

Figure 4:
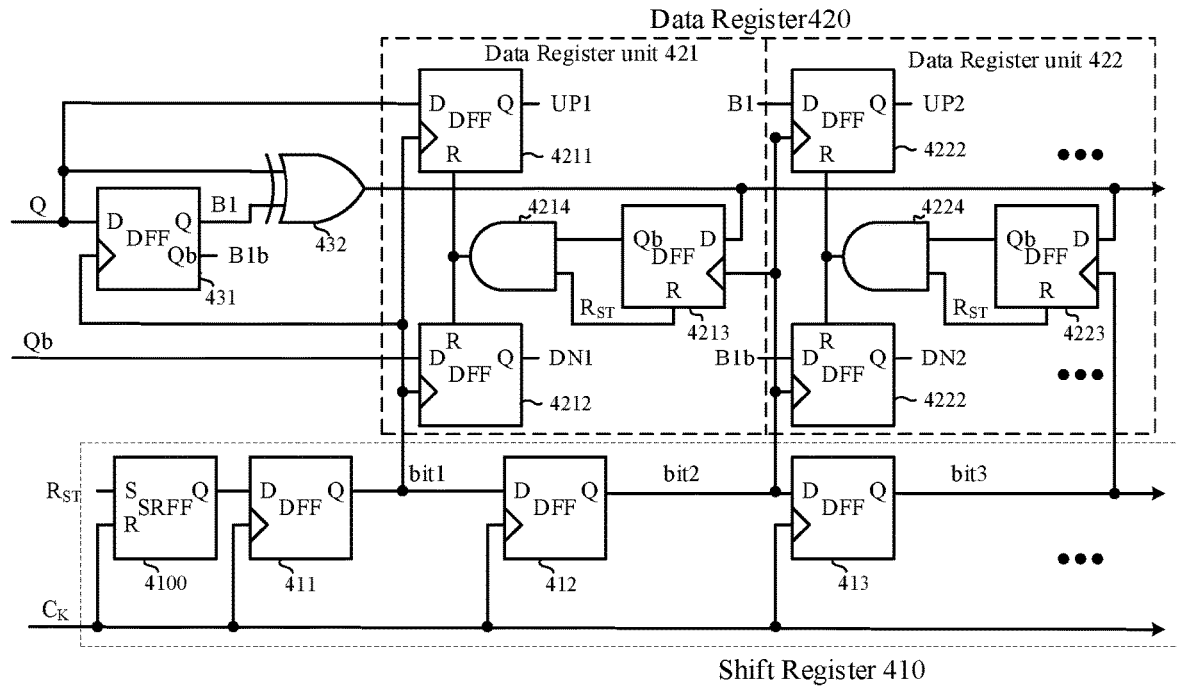
FIG. 4 shows a schematic diagram of the logic circuit used for control in the EMCS SAR ADC.

FIG. 4 shows a schematic diagram of the logic circuit used for control in the EMCS SAR ADC. The logic circuit 400 mainly includes a shift register 410 and a data register 420.

The shift register 410 is shown in the dashed box in the lower part of the figure. The shift register usually consists of 2n+1 flip-flops, including one RS flip-flop 4100 that works before the conversion starts, and n D flip-flops corresponding to each of the n bits (the first 3 bits are shown in the figure). three D flip-flops 411, 412 and 413) and n flip-flops (not shown in FIG. 4) for outputting the conversion result after the conversion is completed. The flip-flops in the shift register are cyclically activated to provide bit-wise clock signals to the flip-flops in the upper data register.

The data register shown in FIG. 4 provides the corresponding connection signal for the capacitor in the CDAC. Since the capacitor bottom plate has three possibilities of connecting vdd, gnd and vcm after sampling, the data register needs more flip-flops. As shown by the dashed box in the upper part of FIG. 4, the data register 420 includes a plurality of data register units (data register units 421 and 422 are shown in the figure). Each data register unit includes three D flip-flops and an AND gate. For an n-bit SAR ADC, n such data register units are required. FIG. 4 also includes a logic circuit for sending a reset signal when the comparison results of two bits before and after are different, and the circuit includes a D flip-flop 431 and an XOR gate 432.

The working flow of the logic circuit shown in FIG. 4 will be briefly described below with reference to FIG. 3. The first bit comparison is performed under the capacitor connection as shown in state I in FIG. 3, and in the case where the D flip-flop in the shift register outputs Q=1 (ie, bit 1 as shown), the resulting comparison results Q and Qb are respectively sent to the upper flip-flop 4211 and the lower flip-flop 4212 in the data register unit 421, and thus the outputs of UP1 and DN1 are obtained. Here, Assuming that Q is 1 (ie Qb=0), it corresponds to VP<VN, so UP1=1 and DN1=0 can connect the highest-order capacitaor of the upper group to Vdd, and connect the highest-order capacitance of the lower group to gnd, this corresponds to state II shown in FIG. 3. Similarly, when Q is 0 (ie, Qb=1), it corresponds to VP>VN, so UP1=0 and DN1=1 can connect the highest-order capacitaor of the upper group to gnd, and the highest-order capacitaor of the lower group to Vdd, which corresponds to state III shown in FIG. 3.

Then, when the second bit is compared, if the comparison result is the same as the comparison result of the previous bit (that is, MSB), the XOR gate 432 has no output when the two inputs are the same, and since the values of B1 and B1b are the value of the comparison result of MSB, so the outputs of UP2 and DN2 obtained from D flip-flops 4221 and 4222 are also the same, that is, the second-bit capacitor replicates the connection of the previous-bit capacitor. This situation corresponds to states IV and VII shown in FIG. 3.

When the second bit is compared, if the comparison result is different from the comparison result of the previous bit, the XOR gate 432 has an output when the two inputs are different, so that the D flip-flop 4213 in the previous data register unit 421 has D=1 input (bit 2 as the clock has also come at this time), thereby causing D flip-flops 4211 and 4212 to be reset to zero by the output Q of D flip-flop 4213. The switch connection can be implemented such that when the UP and DN signals are simultaneously zero, the capacitor of the corresponding bit is changed to connect to vcm. Since the value of B1 and B1b is the value of the comparison result of MSB, the obtained outputs of UP2 and DN2 are the same as those of UP1 and DN1. Therefore, when the comparison result of the current bit is different from the comparison result of the previous bit, the connection of the capacitor of the current bit is copied to the capacitor of the previous bit, and at the same time, the capacitor of the previous bit is changed to vcm. This situation corresponds states V and VI shown in FIG. 3.

Figure 5:
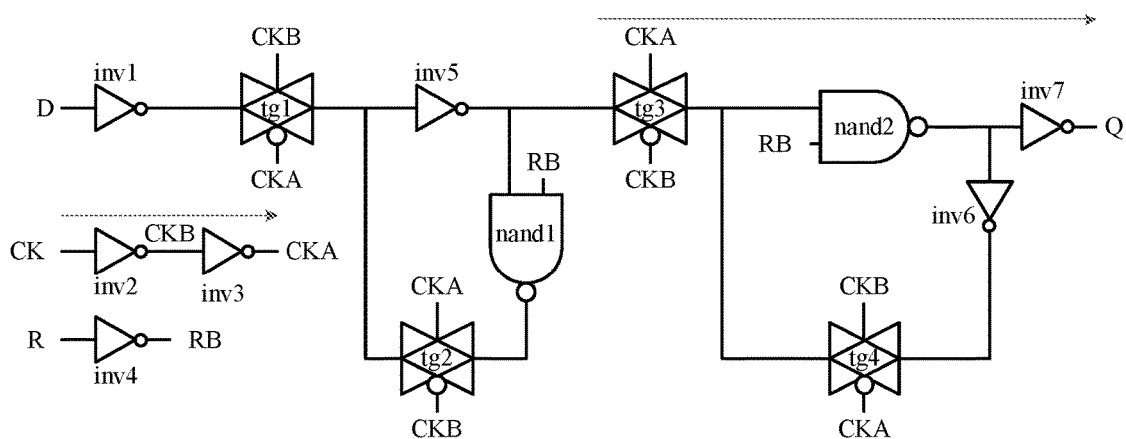
FIG. 5 shows a composition example of a conventional D flip-flop.

When comparing the subsequent bits, the above process can be repeated, and details are not repeated here. In the logic circuit shown in FIG. 4, each data register unit consists of three D flip-flops and an AND gate. FIG. 5 shows a composition example of a conventional D flip-flop.

As shown in FIG. 5, a conventional D flip-flop requires 2 NAND gates, 4 transmission gates and 7 inverters. Although the D flip-flop formed by those elements is very reliable, it also has disadvantages such as slow speed and too many transistors required. If the conventional D flip-flop structure shown in FIG. 5 is used directly, then 6 NAND gates, 12 transmission gates and 21 inverters plus an AND gate are required to implement a data register unit shown in FIG. 4. In the case of a large number of SAR ADC bits, these D flip-flops will require a large number of transistors to implement, so they occupy a large area and have a slow response speed.

In view of this, the present disclosure proposes a high-speed D flip-flop with a simpler structure and a faster speed, and a data register unit formed therefrom. Therefore, the technical solution of the present disclosure can realize accurate switching of the CDAC capacitor array with a much simpler circuit, shorten the data transmission path and thereby improve the processing speed.

Figure 6A:
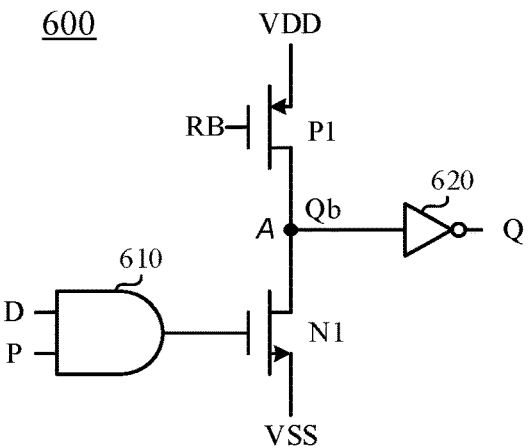
FIGS. 6A-C illustrate a circuit diagram of a high-speed flip-flop according to an embodiment of the present disclosure and its working principle diagram.
Figure 6B:
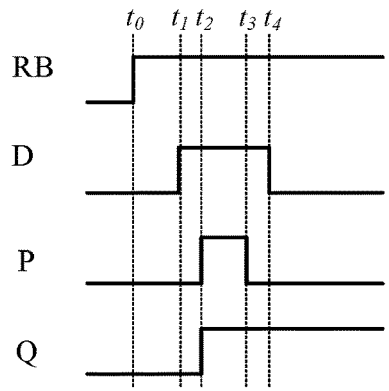
Figure 6C:
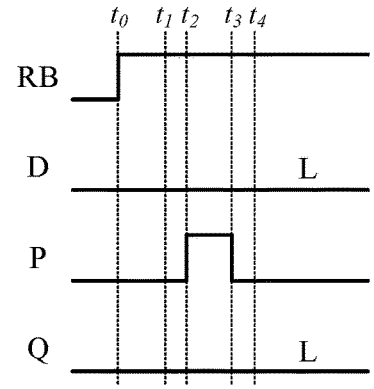

FIGS. 6A-C illustrate a circuit diagram of a high-speed flip-flop according to an embodiment of the present disclosure and its working principle diagrams. Compared with the conventional D flip-flop shown in FIG. 5, the structure of the high-speed flip-flop circuit 600 shown in FIG. 6A is extremely simple, and only includes an AND gate 610, an inverter 620, and a PMOS transistor P1 (the first PMOS transistor P1). transistor) and an NMOS transistor N1 (the first NMOS transistor). And the high-speed flip-flop circuit 600 can be used as a high-speed D flip-flop in the data register unit shown in FIG. 7.

Figure 7:
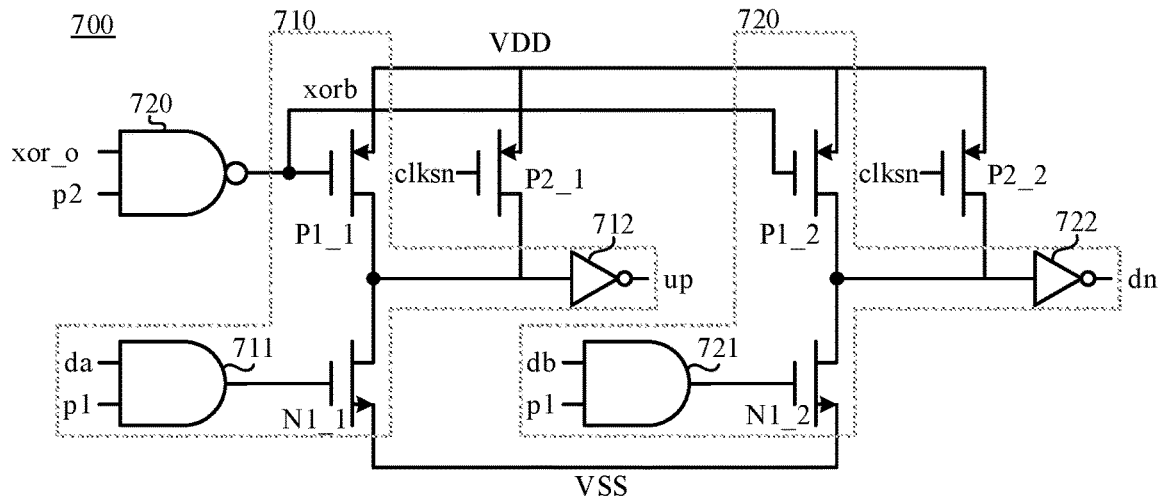
FIG. 7 shows a schematic diagram of the composition of a data register unit according to an embodiment of the present disclosure.

Here, D is a data input terminal, P can be regarded as a clock terminal (which can be used to receive bit pulses from the shift register in FIG. 7), RB is a reset terminal (i.e., reset terminal) and can be set low level is valid. Specifically, the source of the transistor N1 is connected to the power supply terminal (i.e., VDD), the gate is used as a reset terminal, and the drain is connected to the first node A. The drain of the transistor N1 is connected to the first node A, the gate is connected to the output terminal of the AND gate 610, the source is connected to the common connection terminal (i.e., VSS), one terminal of the inverter 620 is connected to the first node A, and the other terminal is used as a output terminal of the high-speed trigger circuit (corresponding to the Q terminal of the D flip-flop, at this time, the first node A on the other side of the inverter can be regarded as the Qb terminal of the D flip-flop).

The working principle of the high-speed D flip-flop will be described below with reference to FIGS. 6B-C, wherein FIG. 6B and FIG. 6C are respectively for the case where the data input terminal D inputs a high-level signal and a low-level signal.

First, in FIG. 6B, before time to, the RB, D and P terminals are all low level, and the transistor P1 is turned on, the transistor N1 is turned off, Qb at the first node A is high, and Q keeps low. At $t_0$, RB is pulled high, and the transistor P1 is turned off. Then, at $t_1$, the input data D goes high, and at time $t_2$, P also jumps high. At $t_2$, D and P are high at the same time, so transistor N1 is turned on, pulling Qb at the first node A down to 0, and causing Q to jump high.

Correspondingly, in FIG. 6C, before $t_0$, the RB, D and P terminals are all low, and the transistor P1 is turned on, the transistor N1 is turned off, Qb at the first node A is high, and Q keeps low. At $t_0$, RB is pulled high, and the transistor P1 is turned off. Subsequently, since the input data D remains low, even if P jumps high at $t_2$, the transistor N1 will not be turned on, so Qb remains high and Q remains low.

Thus, when P jumps high, data D can be transmitted to Q. If data D is high before P, Q jumps high; if data D remains low, Q also remains low. Compared with the conventional D flip-flop shown in FIG. 5, the high-speed D flip-flop of the present disclosure shown in FIG. 6A has a much simpler structure, which greatly saves the transistors required to realize the trigger function, and improves the operation speed of D flip-flop. The transmission path of the conventional D flip-flop is shown by the arrow in FIG. 5, and the path includes 3 inverters, 1 transmission gate and 1 NAND gate. However, in the high-speed D flip-flop of the present disclosure shown in FIG. 6A, the transmission path from D to Q only passes through one AND gate, one NMOS transistor and one inverter. Obviously, the data transmission path of the high-speed D flip-flop of the present disclosure is shorter, and the resulting delay is also shorter, so that it can better meet the requirements of the high-speed SAR ADC.

Those skilled in the art can understand that, due to the simple structure, the gate of P1 is in a high resistance state after to. In order to avoid the signal reliability problem caused by the high-impedance state, the present D flip-flop can be limited to medium and high-speed conversion scenarios (in a high-speed ADC, the high-impedance point can be quickly refreshed, so there will be no level error due to leakage current), avoid strong interference in the design, and preferably can ensure the stable transmission of the signal through the reasonable selection of the generation timing and width of the P pulse. This ensures that the simple structure shown in FIG. 6A can also realize the generation of the CDAC capacitance switching signal with high reliability.

The basic structure of the high-speed D flip-flop shown in FIG. 6A can preferably be used to form a data register unit for performing CDAC capacitor switching. FIG. 7 shows a schematic diagram of the composition of a data register unit according to an embodiment of the present disclosure. The data register unit 700 shown in FIG. 7 can be used as a replacement for the data register units 421 and 422 shown in FIG. 4.

As shown in FIG. 7, the data register unit 700 mainly includes a first high-speed flip-flop 710, a second high-speed flip-flop 720 and a first logic gate 730 (which is relatively simple implemented as a NAND gate shown in the figure).

Here, the first high-speed flip-flop 710 and the second high-speed flip-flop 720 each framed by a dotted line may have the same circuit structure, that is, both can be implemented by the high-speed flip-flop circuit shown in FIG. 6A, and each includes a first PMOS transistor P1, the first NMOS transistor N1, an inverter and a logic gate (the simplest implementation is the AND gate shown in the figure), wherein the source of the transistor P1 is connected to VDD, the gate is connected to the output of the first logic gate, and the drain is connected to the first node A, the drain of the transistor N1 is connected to the first node A, the gate is connected to the output terminal of the AND gate, and the source is connected to VSS, one terminal of the inverter is the first node A, and the other terminal is used as the output terminal of the high-speed flip-flop circuit.

The first high-speed flip-flop 710 is used to generate the up signal. Similar to FIG. 6A, the two input terminals of the AND gate 711 are also connected to the data terminal (da in the figure) and the bit pulse (p1 in the figure). The output of the AND gate 711 serves as the control terminal of the first NMOS transistor N1_1, and the output from the NAND gate 730 (i.e., the first logic gate) serves as the control terminal of the first PMOS transistor P1_1.

The first high-speed flip-flop 720 is used to generate the dn signal. Similar to FIG. 6A, the two input terminals of the AND gate 721 are also connected to the data terminal (db in the figure) and the bit pulse (p1 in the figure). The output of the AND gate 721 serves as the control terminal of the first NMOS transistor N1_2. The output from the NAND gate 730 (i.e., the first logic gate) also serves as the control terminal of the first PMOS transistor P1_2.

The data register unit 700 constructed by the high-speed flip-flop proposed by the present disclosure can realize the function of replicating the connection of the MSB bit capacitor in the current bit, and when the comparison result of the next bit is different from the comparison result of the MSB bit, the capacitor of the current bit is connected to vcm, i.e. up and dn are equal to Q and Qb (MSB) or equal to B1 and B1b (remaining bits) when shifting to the current bit, up and dn are reset when the XOR gate output is valid, thereby enabling replacement of the data register units (e.g., 421 and 422) shown in FIG. 4.

Specifically, one input terminal of the respective logic gates (i.e., 711 and 721) of the first high-speed flip-flop 710 and the second high-speed flip-flop 720 is used to receive the bit pulse (p1) of the current bit, and the other input terminal is used to receive the results of the most significant bits opposite to each other. Specifically, when the current bit is the MSB, the data input da received at 711 corresponds to the MSB comparison result output Q of the comparator 130, and the data input db received at 721 corresponds to the MSB comparison result output Qb of the comparator 130; and at other bits, the data input da received at 711 corresponds to the output B1 of the D flip-flop 431, and the data input db received at 721 may correspond to the output B1 b of the D flip-flop 431. In other words, no matter which bit is currently being compared, one input terminal of the AND gates 711 and 721 is inputted with the opposite comparison results of the MSB bits. Thus, when the bit pulse of the current bit is valid (for example, D signal is transmitted when P jumps high as described in conjunction with FIGS. 6A-C), the respective output terminals of the first high-speed flip-flop 710 and the second high-speed flip-flop 720 can output flip-flop outputs opposite to each other, which correspond to the comparison result of the highest-order comparator, that is, the level of up is the same as that of da, and the level of dn is the same as that of db.

One input terminal of the NAND gate 730 is used to receive the bit pulse of the next bit (p2), and the other input terminal is used to receive the XOR signal (xor_o). The XOR signal becomes valid when the next bit comparison result is different from the most significant bit comparison result (e.g., based on the decision of the XOR gate 432), and the NAND gate 720 issues a first reset signal to the gates of the first PMOS transistors (P1_1 and P1_2) when the next bit pulse and the XOR signal are simultaneously valid, so that the outputs of the first high-speed flip-flop 710 and the second high-speed flip-flop 720 are reset (i.e., the NAND gate 730 outputs the low level when both inputs are high, the low level makes P1_1 and P1_2 turn on, so that both up and dn become low, and thus the two capacitors corresponding to the current bit are changed to connect to vcm.

In one embodiment, the bit pulse is the bit output signal of the shift register, such as bit 1, bit 2 and bit 3 shown in FIG. 4. In a preferred embodiment, the bit pulse is not the bit output signal of the shift register, but a delayed and narrowed signal based on the bit output signal. In a specific implementation, a bit pulse is the signal generated when the bit output signal of the shift register (bit n) is valid together with a delayed and narrowed clock signal (see clkcd in FIG. 11). Here, as shown in FIG. 1, the shift register 110 and the comparator 130 operate under the control of the same clock signal clkc, e.g., both operate on the rising edge of clkc. Since it takes time for the comparator 130 to derive a comparison result based on the input, the delay of the bit pulse (pn) relative to the bit output signal (bit n) needs to allow the bit pulse to be generated later than the current bit comparison result, and preferably allow the bit pulse earlier than the end of the comparison result (the falling edge of pn is earlier than the falling edge of corresponding Q in FIG. 10), thereby ensuring correct signaling of the high speed D flip-flop of the present disclosure.

Further, each high-speed flip-flop circuit maycan additionally include a second PMOS transistor P2 for resetting the output. Specifically, as shown in FIG. 7, although shown outside the dashed-line box, the first high-speed flip-flop 710 includes a second PMOS transistor P2_1, and the second high-speed flip-flop 720 includes a second PMOS transistor P2_2. The transistors P2_1 and P2_2 have their sources connected to VDD, their gates connected to the same reset clock clksn, and their drains connected to the respective first nodes A_1 and A_2. The second PMOS transistors P2_1 and P2_2 are turned on when the reset clock clksn is valid (i.e., goes high) so that the output of the flip-flop circuit is reset (i.e., both up and dn go low). The reset clock clksn become valid during the sampling phase of the SAR ADC, thereby resetting the output of each high-speed D flip-flop.

The data register units of the present disclosure as shown in FIG. 7 can be combined by bit to obtain a data register according to the present disclosure, which can be used as the data register 120 shown in FIG. 1, thereby realizing a simplified circuit with EMCS control logic.

Figure 8:
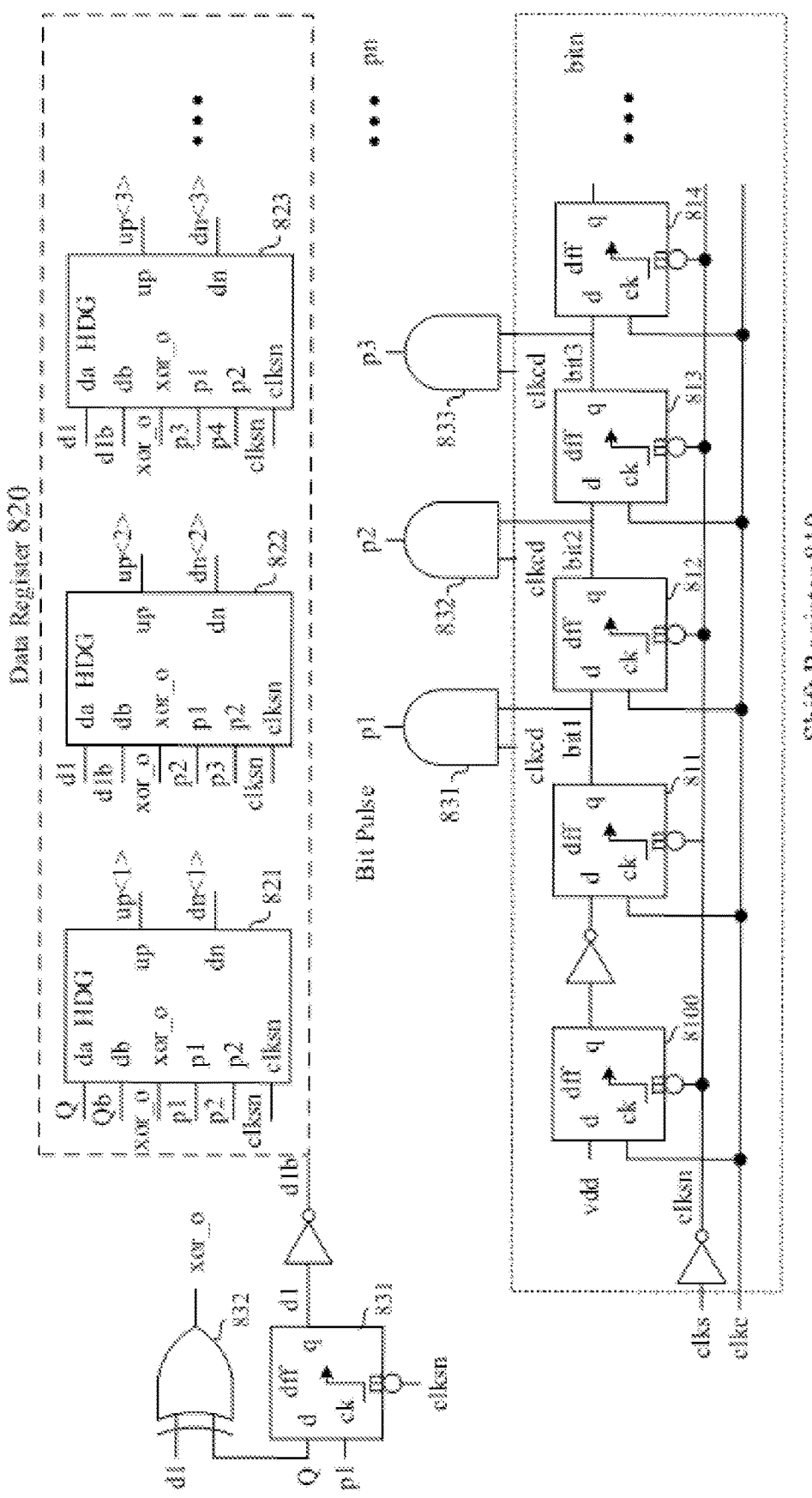
FIG. 8 shows a schematic diagram of the composition of the switching logic circuit of the EMCS SAR ADC according to an embodiment of the present disclosure.

FIG. 8 shows a schematic diagram of the composition of the switching logic circuit of the EMCS SAR ADC according to an embodiment of the present disclosure. The logic circuit 800 can perform the same control function as the logic circuit 500 shown in FIG. 4, but can operate at a faster speed with a simpler circuit (fewer transistors).

The logic circuit 800 has a shift register 810 similar to the logic circuit shown in FIG. 4 (with the exception that a D flip-flop 8100 and an inverter are used in FIG. 8 instead of the RS flip-flop 4100 in FIG. 4), and a logic circuit for sending an XOR signal (xor_o) when the comparison results of the two bits before and after are different, the circuit includes a D flip-flop 831 and an XOR gate 832.

Different from that shown in FIG. 4, the logic circuit 800 is composed of data register units of present disclosures (821, 822 and 823 . . . shown in modular form in the figure), and each data register unit does not directly receive the bit output signal (bit n), but receives the bit pulse signal (p1, p2, p3, . . . ) generated when the bit output signal (bit 1, bit 2, bit 3, . . . ) and the delayed and narrowed clock signal (see clkcd in FIG. 11) are valid together. As shown in the figure, additionally set logic gate circuits (shown as AND gates 841, 842, 843 . . . ) are used to obtain the bit pulse signal.

Using the logic circuit shown in FIG. 8, the present disclosure can be implemented as a successive approximation analog-to-digital converter (SAR ADC), including: a comparator; a capacitive digital-to-analog converter (CDAC); and a logic control circuit (e.g., the SAR logic 800). The logic control circuit includes: a shift register (corresponding to 810) and a data register (corresponding to 820) composed of the data register unit of the present disclosure. In a further embodiment, the SAR ADC can also including a flip-flop (corresponding to 831) for storing the most significant comparison result, receiving and latching the most significant comparison result d1 when the most significant bit pulse p1 is valid, and for each of the data register units (821, 822 and 823 . . . ) use, for example, provide the most significant comparison result d1 and its inversion signal d1b to the da and db terminals (i.e., the input terminals of the logic gates 711 and 721 in FIG. 7) of each of the data register units (821, 822 and 823 . . . ); and an exclusive OR logic gate (corresponding to 832) for receiving the comparison result of the next bit and the comparison result of the MSB as input and output a XOR signal (xor_o) when the comparison result of the next bit and the comparison result of the MSB is different as a input of a first logic gate (corresponding to 730 in FIG. 7).

The SAR ADC is implemented as an n-bit (e.g., 12-bit) analog-to-digital converter, and the data register consists of n e data register units. When the bit pulse of the current bit (for example, for the data register unit 822, the current bit pulse is p2) is valid, each data register unit receives the comparison result of the most significant bit (for example, d1 and d1b) and outputs. The output is used for the CDAC to connect the current bit capacitor (for example, the capacitor corresponding to bit 2) to the power supply terminal and the ground. Each data register unit resets the output when the next bit pulse (for example, for the data register unit 822, the next bit pulse is p3) is valid and the XOR signal (xor_o) is valid at the same time, and the reset output is used by the CDAC to connect the current bit capacitor (for example, the capacitor corresponding to bit 2) to vcm.

Figure 11:
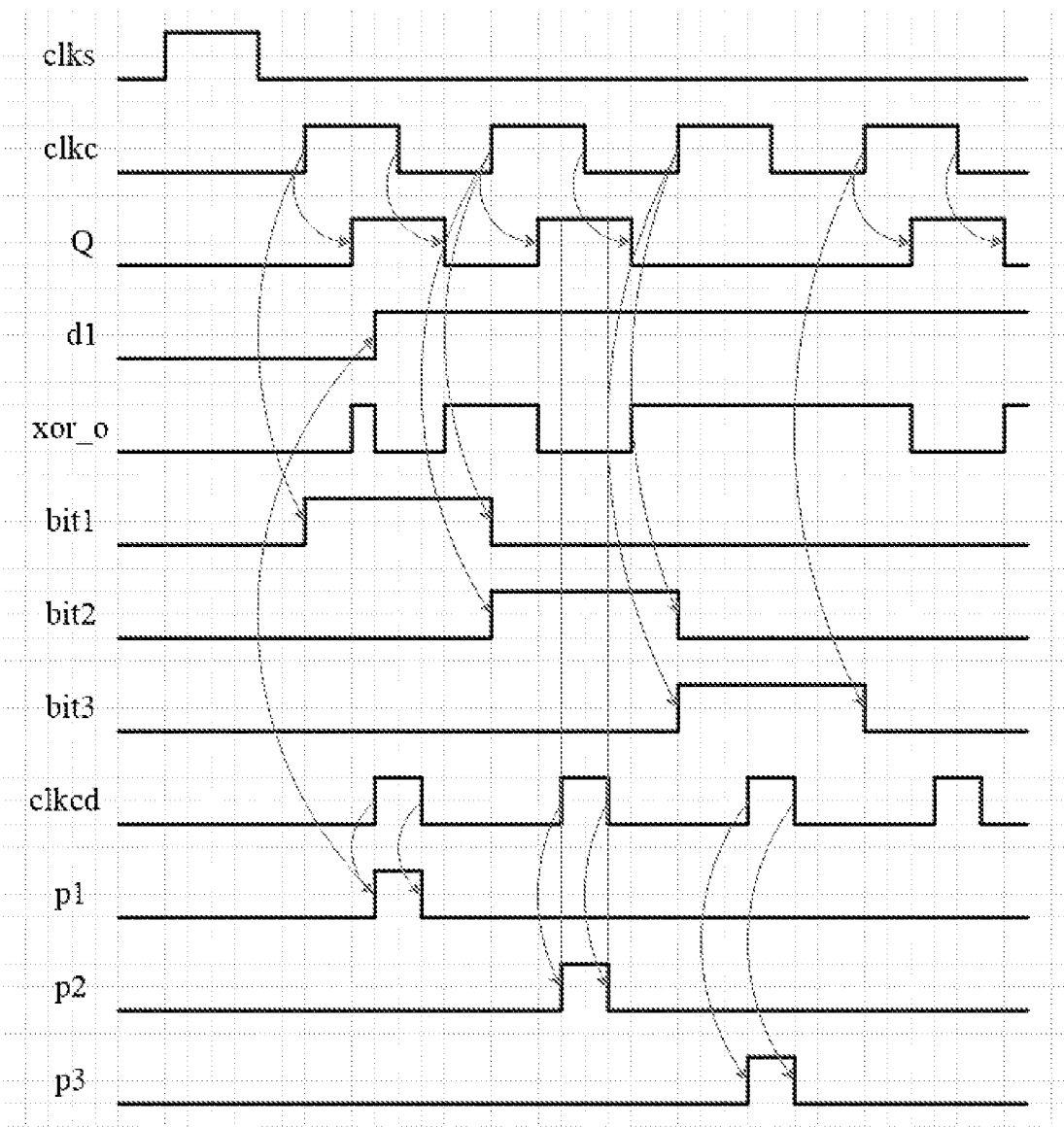
FIG. 11 shows a timing diagram of an EMCS SAR ADC switch switching logic circuit according to one embodiment of the present disclosure.

The comparator is a dynamic comparator that operates under the control of the operating clock. The logic control circuit further includes: bit pulse generation logic gates (e.g., logic gates 841, 842, 843 shown in FIG. 8) for generating the bit pulse (for example, p1, p2, p3 . . . in FIG. 8) when the bit output signal (for example, bit1, bit2, bit3 . . . shown in FIG. 8) of the shift register (e.g., the shift register 810 shown in FIG. 8) and the delayed and narrowed operating clock (for example, clkcd shown in FIGS. 8 and 11) are valid at the same time. The comparator (for example, the comparator 130 shown in FIG. 1 or the dynamic comparator shown in FIG. 9) operates under the control of the operating clock clkc to generate comparison results (such as Q and its inverse Qb), the operating clock clkc is delayed until the dynamic comparator generates a comparison result, that is, as shown in FIG. 11, the rising edge of clkcd is later than the rising edge of Q.

Figure 9:
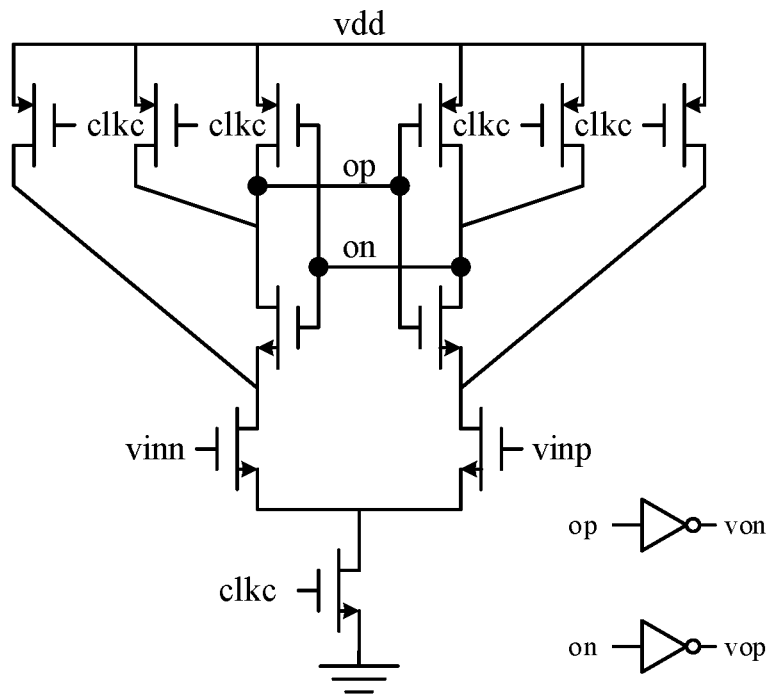
FIG. 9 shows a schematic diagram of the composition of a dynamic comparator used in an embodiment of the present disclosure.
Figure 10:
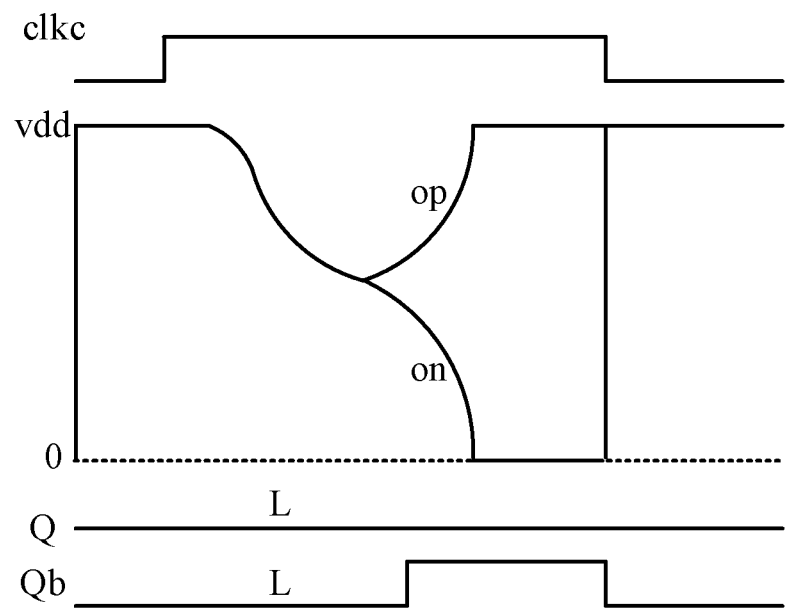
FIG. 10 shows a schematic diagram of the level change of the two output terminals after the dynamic comparator starts to work.

FIG. 9 shows a schematic diagram of the composition of a dynamic comparator used in an embodiment of the present disclosure. FIG. 10 shows a schematic diagram of the level change of the two output terminals after the dynamic comparator starts to operate. The dynamic comparator shown in the figure outputs a reset level of a high level (for example, Vdd in the figure) when the operating clock clkc is low, starts the comparison when the rising edge of clkc arrives, and based on the relative level of vinn and vinp, one of the two outputs must be pulled low (shown as on), and forced to be pulled high after the falling edge of clkc arrives. In a preferred embodiment, an inverter can be connected after each of the two outputs op and on. By setting the inversion threshold of the inverters reasonably, it is possible to ensure that for an output which is not pulled down to 0 (shown as op), its inverted output Q is always output low (L), while for an output which is pulled low before the arrival of the falling edge of clkc (shown as on), its inverted output Qb outputs a high pulse.

Although the figure shows a dynamic comparator whose reset level is high and compares after the operating clock jumps high, those skilled in the art should understand that a dynamic comparator with a low reset level or a dynamic comparator that compares after the operating clock jumps low can also be used. But no matter what kind of comparator is used, when the dynamic comparator is comparing normally, its two outputs (whether on and op) must have different levels, so one of Q and Qb will always generate a high level pulse.

As can be understood from the above with reference to FIG. 10, in order to generate a correct capacitor switching signal based on the comparison result, after clkc becomes valid, the capacitor switching operation must be processed after the distinction between Q and Qb shown in FIG. 10, so the bit pulse needs to be delayed until Q and Qb are distinguished.

The operation principle of the logic circuit shown in FIG. 8 will be described below with reference to FIG. 11. FIG. 11 shows a timing diagram of an EMCS SAR ADC switching logic circuit according to one embodiment of the present disclosure.

clks is the sampling clock of the SAR ADC, which is valid when high. During the period when clks is high, the external circuit can read the n-bit comparison result of the SAR ADC in this round, and since clksn becomes low, as shown in FIG. 7, the second PMOS transistor P2 of the high-speed D flip-flops in each data register unit (for example, 821, 822, 823 . . . ) is turned on, thereby resetting the output of each of the high-speed D flip-flops.

clkc is the operating clock of the comparator. After a period of time after clkc jumps high, the dynamic comparator outputs the comparison results Q and Qb (as shown in FIG. 10, the dynamic comparator needs a certain response time to separate the comparison results Q and Qb), the delay between clkc jumps high and the output of the comparison result is indicated by the curved arrow in FIG. 11 from the rising edge of clkc to the rising edge of Q.

clkc is also the operating clock of the shift register 810, and the bit pulses p1-pn are obtained by ANDing the delayed signal of clkc (clkcd) with the bit output bit1~bitn (n is the number of bits of ADC) of the shift register. Use p1 to capture the output result Q of the comparator and store it on the D flip-flop 831 to obtain d1 and d1$b$. It can be seen that d1 is the stored first comparison result, that is, the comparison result of the MSB. As shown in the figure, since bit 1 jumps high when clkc is valid (the above conversion relationship can be indicated by the curve arrow from each rising edge of clkc to the rising edge of corresponding bit n in FIG. 11), it is the jump high of clkcd that determines p1 is valid, p1 valid make the D flip-flop 831 obtain d1, and the above conversion relationship can be indicated by the curve arrow from the rising edge of clkcd to the rising edge of p1 to the rising edge of d1 in FIG. 11.

The subsequent comparison results are compared with d1. If they are the same, the XOR signal xor_o is low, and if they are different, xor_o is high. Pulse p1 grabs Q and Qb to determine the level of up<1> and dn<1>. Pulse p2 grabs d1, d1$b$ to determine the level of up<2>, dn<2>, while pulse p2 grabs xor_o to decide whether to pull up<1>, dn<1> low, and pull vcm<1> high (if vcm<1> is high, the first bit is reset, and it's true for other bits). Pulse pn grabs d1, d1$b$ to determine the level of up<n>, dn<n>, pulse p (n+1) grabs xor_o to decide whether to pull up<n>, dn<n> low, and pull vcm<n> high.

If pn is defined as bit pulse, Q, Qb, d1, d1$b$, xor_o, which contain comparator comparison result information, are defined as bit data, then the logic shown in FIG. 8 implies the idea of using bit pulse to grab bit data, and then determine the connection of the CDAC capacitor switch according to the grab result.

In another embodiment of the present disclosure, as shown in FIG. 6A, the high-speed flip-flop circuit of the present disclosure can also be used in logic circuits of SAR ADCs using other MCSs (Merged Capacitor Switching) other than the EMCS algorithm. To this end, the present disclosure can be implemented as a successive approximation analog-to-digital converter including a data register for Merged Capacitor Switching, a data register including a high-speed flip-flop circuit that generates a capacitor connection signal based on a comparison result, wherein the high-speed flip-flop circuit includes: a first PMOS transistor, a first NMOS transistor, an inverter and a logic gate, wherein the source of the first PMOS transistor is connected to the power supply terminal, the gate is connected to the output of the first logic gate, and the drain is connected to an output of the comparison result, the drain of the NMOS transistor is connected to a first node (A), the gate is connected to the output terminal of the logic gate, the source is grounded (VSS), and one terminal of the inverter is connected to the first node node, and the other terminal serves as the output terminal of the high-speed flip-flop circuit.

In conventional MCS SAR ADC logic, if the comparison result of the next bit is different from MSB, instead of connecting the capacitor of the current bit back to vcm, the capacitor of the current bit is reversed (for example, it was originally connected to vdd at the top and connected to gnd at the bottom, now it is connected to gnd at the top and connected to vdd at the bottom). Therefore, on the basis of the high-speed flip-flop circuit shown in FIG. 6A, a logic circuit can be added, for inverting up<n> and dn<n> when xor_o and p (n+1) are simultaneously valid. Each D flip-flop used by the data register unit in the MCS logic can still use the high-speed flip-flop circuit proposed in the present disclosure.

The present disclosure can also be implemented as an electronic device including the successive approximation analog-to-digital converter as described above.

A high-speed flip-flop circuit is described above with reference to the accompanying drawings, which has an extremely simple structure and is suitable for fast operation. The high-speed flip-flop circuit is particularly suitable for use in EMCS control logic to replace the conventional D flip-flop in the data register unit, and thereby obtain the data register unit implemented with the high-speed flip-flop circuit of the present disclosure. The above data register unit can be combined with bit pulses to realize reliable reading of the capacitor switch signal based on the comparison result. Therefore, the SAR logic circuit formed by the data register unit of the present disclosure can significantly reduce the number of required transistors and improve the operating speed of the SAR ADC.

Various embodiments of the present disclosure have been described above, and the foregoing descriptions are exemplary, not exhaustive, and not limiting of the disclosed embodiments. Numerous modifications and variations will be apparent to those of ordinary skill in the art without departing from the scope and spirit of the described embodiments. The terminology used herein was chosen to best explain the principles of the various embodiments, the practical application or improvement over the technology in the marketplace, or to enable others of ordinary skill in the art to understand the various embodiments disclosed herein.

What is claimed is:

1. A data register unit comprising:
    a first high-speed flip-flop;
    a second high-speed flip-flop;
    a first logic gate,
    wherein, the first high-speed flip-flop and the second high-speed flip-flop comprise a high-speed flip-flop circuit respectively, and the high-speed flip-flop circuit comprises: a first PMOS transistor, a first NMOS transistor, an inverter and a logic gate, the source of the first PMOS transistor is connected to a power supply terminal, the gate is connected to the output of the first logic gate, the drain is connected to a first node, and the drain of the NMOS transistor is connected to the first node and the gate is connected to the output terminal of the logic gate, the source is connected to the common connection end, one terminal of the inverter is connected to the first node, and the other terminal is used as the output terminal of the high-speed flip-flop circuit.

2. The data register unit of claim 1, wherein,
    one input terminal of the respective logic gates of the first high-speed flip-flop and the second high-speed flip-flop is used to receive the bit pulse of a current bit, and the other input terminal is used to receive opposite comparison results of a most significant bit (MSB), so that the respective output terminals of the first high-speed flip-flop and the second high-speed flip-flop output flip-flop outputs opposite to each other and corresponding to the comparison result of the MSB when the bit pulse of the current bit is valid;
    one input terminal of the first logic gate is used to receive the bit pulse of a next bit, and the other input terminal is used to receive an XOR signal, and the XOR signal is used to become valid when the comparison result of the next bit is different from the comparison result of the MSB, and the first logic gate sends a first reset signal to the gate of the first PMOS transistor under the condition that the bit pulse of the next bit and the XOR signal are valid at the same time, so that both outputs of the first high-speed flip-flop and the second high-speed flip-flop are reset.

3. The data register unit of claim 2, wherein the comparison result of the MSB and the comparison result of the next bit are generated by the comparator operating under the control of an operating clock, and the bit pulse is a signal generated when a bit output signal of the shift register and a delayed and narrowed operating clock are valid at same time.

4. The data register unit of claim 1, wherein the high-speed flip-flop circuit further comprises:
a second PMOS transistor, the source of the second PMOS transistor is connected to the power supply terminal, the gate is connected to a reset clock, and the drain is connected to the first node,
wherein, the second PMOS transistor is turned on when the reset clock is valid, to reset the output of the high-speed flip-flop circuit.

5. A successive approximation analog-to-digital converter (SAR ADC) comprising:
a comparator;
a capacitive digital-to-analog converter (CDAC); and
a logic control circuit, the logic control circuit comprises:
a shift register; and
a data register consisting of data register units, the data register unit comprising:
a first high-speed flip-flop;
a second high-speed flip-flop;
a first logic gate,
wherein, the first high-speed flip-flop and the second high-speed flip-flop comprise a high-speed flip-flop circuit respectively, and the high-speed flip-flop circuit comprises: a first PMOS transistor, a first NMOS transistor, an inverter and a logic gate, the source of the first PMOS transistor is connected to a power supply terminal, the gate is connected to the output of the first logic gate, the drain is connected to a first node, and the drain of the NMOS transistor is connected to the first node and the gate is connected to the output terminal of the logic gate, the source is connected to the common connection end, one terminal of the inverter is connected to the first node, and the other terminal is used as the output terminal of the high-speed flip-flop circuit.

6. The SAR ADC of claim 5, wherein the SAR ADC is an n-bit ADC, and the data register is composed of n the data register units, and,
when a bit pulse of a current bit is valid, each of the n data register units receives and outputs a comparison result of a most significant bit (MSB), and the output is used by the CDAC to connect current bit capacitors to the power supply terminal and to ground, respectively,
when the bit pulse of a next bit is valid and the XOR signal is valid at the same time, each of the n data register units resets the output, wherein the reset output is used for the CDAC to connect the current bit capacitors to common mode voltage.

7. The SAR ADC of claim 5, wherein the logic control circuit further comprises:
a flip-flop for storing the comparison result of the MSB, configured to receive and latch the comparison result of the MSB when a bit pulse of the MSB is valid, which will be used by each of the data register units.

8. The SAR ADC of claim 5, wherein the logic control circuit further comprises:
an exclusive OR logic gate, configured to receive the comparison result of the next bit and the comparison result of the MSB as input, and output an XOR signal as an input to the first logic gate when the comparison result of the next bit is different from the comparison result of the MSB.

9. The SAR ADC of claim 5, wherein the comparator is a dynamic comparator that operates under the control of an operating clock, and the logic control circuit further comprises:
a bit pulse generation logic gate, configured to generate the bit pulse when a bit output signal of the shift register and the delayed and narrowed operating clock are valid at the same time, wherein the operating clock is delayed until the dynamic comparator generates a comparison result before it becomes valid.

10. The SAR ADC of claim 5, wherein,
one input terminal of the respective logic gates of the first high-speed flip-flop and the second high-speed flip-flop is used to receive the bit pulse of a current bit, and the other input terminal is used to receive opposite comparison results of a most significant bit (MSB), so that the respective output terminals of the first high-speed flip-flop and the second high-speed flip-flop output flip-flop outputs opposite to each other and corresponding to the comparison result of the MSB when the bit pulse of the current bit is valid;
one input terminal of the first logic gate is used to receive the bit pulse of a next bit, and the other input terminal is used to receive an XOR signal, and the XOR signal is used to become valid when the comparison result of the next bit is different from the comparison result of the MSB, and the first logic gate sends a first reset signal to the gate of the first PMOS transistor under the condition that the bit pulse of the next bit and the XOR signal are valid at the same time, so that both outputs of the first high-speed flip-flop and the second high-speed flip-flop are reset.

11. The SAR ADC of claim 10, wherein the comparison result of the MSB and the comparison result of the next bit are generated by the comparator operating under the control of an operating clock, and the bit pulse is a signal generated when a bit output signal of the shift register and a delayed and narrowed operating clock are valid at same time.

12. The SAR ADC of claim 5, wherein the high-speed flip-flop circuit further comprises:
a second PMOS transistor, the source of the second PMOS transistor is connected to the power supply terminal, the gate is connected to a reset clock, and the drain is connected to the first node,
wherein, the second PMOS transistor is turned on when the reset clock is valid, to reset the output of the high-speed flip-flop circuit.

13. An electronic device comprising a SAR ADC, the SAR ADC comprising a data register for Merged Capacitor switching (MCS), the data register comprising a high-speed flip-flop circuit that generates a capacitor connection signal based on a bit comparison result, wherein the high-speed flip-flop circuit comprises:
a first PMOS transistor, a first NMOS transistor, an inverter, and a logic gate, wherein the source of the first PMOS transistor is connected to a power supply terminal, the gate is connected to the bit comparison result, and the drain is connected to a first node, the drain of the first NMOS transistor is connected to the first node, the gate is connected to the output terminal of the logic gate, the source is grounded (VSS), one terminal of the inverter is connected to the first node, and the other terminal is used as the output of the high-speed flip-flop circuit.

14. The electronic device of claim 13, wherein the bit comparison result indicates whether a comparison result of a next bit is different from a comparison result of a most significant bit (MSB).

15. The electronic device of claim 13, wherein the SAR ADC is an n-bit ADC, and the data register is composed of n data register units, and each said data register unit comprising: a first high-speed flip-flop; a second high-speed flip-flop; and a first logic gate,
wherein, the first high-speed flip-flop and the second high-speed flip-flop comprise said high-speed flip-flop circuit respectively.

16. The electronic device of claim 15, wherein the data register is for Early Merged Capacitor switching (EMCS), when a bit pulse of a current bit is valid, each of the n data register units receives and outputs a comparison result of a most significant bit (MSB), and the output is used by the CDAC to connect current bit capacitors to the power supply terminal and to ground, respectively,
when the bit comparison result indicates a comparison result of a next bit is different from a comparison result of a MSB, each of the n data register units resets the output, wherein the reset output is used for the CDAC to connect the current bit capacitors to common mode voltage.

17. The electronic device of claim 15, wherein the data register is for Merged Capacitor switching (MCS), when a bit pulse of a current bit is valid, each of the n data register units receives and outputs a comparison result of a most significant bit (MSB), and the output is used by the CDAC to connect current bit capacitors to the power supply terminal and to ground, respectively,
when the bit comparison result indicates a comparison result of a next bit is different from a comparison result of a MSB, each of the n data register units resets the output, wherein the reset output is used for the CDAC to reverse the connection of the current bit capacitors.

18. The electronic device of claim 15, wherein,
one input terminal of the respective logic gates of the first high-speed flip-flop and the second high-speed flip-flop is used to receive the bit pulse of a current bit, and the other input terminal is used to receive opposite comparison results of a most significant bit (MSB), so that the respective output terminals of the first high-speed flip-flop and the second high-speed flip-flop output flip-flop outputs opposite to each other and corresponding to the comparison result of the MSB when the bit pulse of the current bit is valid;
one input terminal of the first logic gate is used to receive the bit pulse of a next bit, and the other input terminal is used to receive an XOR signal, and the XOR signal is used to become valid when the comparison result of the next bit is different from the comparison result of the MSB, and the first logic gate sends a first reset signal to the gate of the first PMOS transistor under the condition that the bit pulse of the next bit and the XOR signal are valid at the same time, so that both outputs of the first high-speed flip-flop and the second high-speed flip-flop are reset.

19. The electronic device of claim 15, wherein the comparison result of the MSB and the comparison result of the next bit are generated by the comparator operating under the control of an operating clock, and the bit pulse is a signal generated when a bit output signal of the shift register and a delayed and narrowed operating clock are valid at same time.

20. The electronic device of claim 15, wherein the high-speed flip-flop circuit further comprises:
a second PMOS transistor, the source of the second PMOS transistor is connected to the power supply terminal, the gate is connected to a reset clock, and the drain is connected to the first node,
wherein, the second PMOS transistor is turned on when the reset clock is valid, to reset the output of the high-speed flip-flop circuit.

\* \* \* \* \*